(12) United States Patent
Wong et al.

(10) Patent No.: US 8,989,406 B2
(45) Date of Patent: Mar. 24, 2015

(54) USER PROFILE BASED AUDIO ADJUSTMENT TECHNIQUES

(75) Inventors: Ling Jun Wong, Escondido, CA (US); True Xiong, San Diego, CA (US)

(73) Assignees: Sony Corporation, Tokyo (JP); Sony Network Entertainment International LLC, Los Angeles, CA (US)

( * ) Notice: Subject to any disclaimer, the term of this patent is extended or adjusted under 35 U.S.C. 154(b) by 999 days.

(21) Appl. No.: 13/045,870

(22) Filed: Mar. 11, 2011

(65) Prior Publication Data

US 2012/0230516 A1 Sep. 13, 2012

(51) Int. Cl.
*H03G 3/00* (2006.01)
*H03G 3/30* (2006.01)
*H03G 3/10* (2006.01)

(52) U.S. Cl.
CPC .............. *H03G 3/3026* (2013.01); *H03G 3/10* (2013.01)
USPC ............... 381/107; 381/28; 381/98; 381/101; 381/102; 381/106; 381/120

(58) Field of Classification Search
CPC .............. H04R 3/04; H04R 5/04; H04R 3/00; H04R 3/12; H04R 2430/01; H03G 3/20; H04N 21/44222; H04N 21/4622; H04N 21/4532; H04N 21/482; H04N 21/25891; H04N 21/6582

USPC ............. 381/28, 98, 101, 102, 104, 106, 107, 381/120; 725/100, 131, 139, 9–21, 133, 725/141, 153
See application file for complete search history.

(56) References Cited

U.S. PATENT DOCUMENTS

| 6,169,807 | B1 | 1/2001 | Sansur |
| 7,680,465 | B2 | 3/2010 | Zad-Issa |
| 2006/0153405 | A1 | 7/2006 | Myers |
| 2007/0086604 | A1 | 4/2007 | Guillorit |
| 2007/0106941 | A1* | 5/2007 | Chen et al. .................... 715/728 |
| 2008/0025538 | A1* | 1/2008 | Zad-Issa ...................... 381/315 |
| 2009/0143054 | A1* | 6/2009 | Drescher et al. .............. 455/418 |

FOREIGN PATENT DOCUMENTS

JP 2006352250 12/2006

OTHER PUBLICATIONS

VovoPro, Multi-Format Digital Key Control Karaoke DVD/DivX Player, http://www.vocopro.com/products/pdf_manuals/dvx880.pdf, 2007.
Automatic Gain Control, Wikipedia.com, pp. 1-4, Jan. 21, 2011.

* cited by examiner

*Primary Examiner* — Paul S Kim
(74) *Attorney, Agent, or Firm* — John L. Rogitz

(57) ABSTRACT

Embodiments are directed toward user profile based audio adjustment techniques. The techniques are used to render various audio and/or audio/video content having different audio output parameter values in accordance with a user profile that characterizes a user's desired value and/or range of one or more of the output parameter levels.

12 Claims, 4 Drawing Sheets

USER PROFILE BASED AUDIO ADJUSTMENT TECHNIQUES

BACKGROUND OF THE INVENTION

Computing devices have made significant contributions toward the advancement of modern society and are utilized in a number of applications to achieve advantageous results. Numerous devices, such as digital music players (e.g., MP3 players), smart phones, laptop computers, tablet computers, TVs, DVD players, game consoles, desk top computers and the like have facilitated increased consumption of content in most areas of entertainment, education, business and science. Computing devices have also made it faster, easier and cheaper to access content of all types in digital form. The convenience of having content more readily accessible typically results in users accessing content more often and may also result in users acquiring ever-increasing amounts of content from various sources.

The audio and/or audio video content from different sources may be encoded according to different standards. The different standards may result in different audio output levels when the content is played on a given electronic device. Even for content encoded according to the same standard, different content may be recoded at different audio levels resulting in different audio output levels when the content is played on the electronic device.

The various audio and/or audio/video content having different audio output level can result in users experiencing unexpected changes in the audio output level when listening to such content. The proliferation of playlists including audio and/or audio/video content having one or more differing audio output levels can increase the occurrence of being subjected to unexpected changes in the audio output levels. The differing audio output levels can be distracting or even harmful to the user. For example, a first item of audio or audio/video content may be rendered at a relatively low volume causing the user to increase the volume level. Thereafter a second item of content may be rendered at a much higher volume level that is further increased by the volume adjustment made by the user in response to the level of the first item of content. When the difference is too great, it may cause discomfort or even damage or loss of hearing. Accordingly, there is a continuing need for improved audio rendering techniques.

SUMMARY OF THE INVENTION

The present technology may best be understood by referring to the following description and accompanying drawings that are used to illustrate embodiments of the present technology.

In one embodiment, a user profile based audio adjustment technique includes rendering one or more audio or audio/video configuration samples and receiving one or more user adjustments of one or more audio output parameters in response to the rendered audio or audio/video configuration samples. One or more user adjusted audio output parameter levels and/or ranges are determined from the adjustments and are stored as a user audio profile.

In another embodiment, a user profile based audio adjustment technique includes receiving any of a plurality of audio or audio/video content having one or more differing audio output parameter levels and receiving a user audio profile. One or more audio output parameters of the audio or audio/video content are adjusted during rendering in accordance with the user audio profile.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
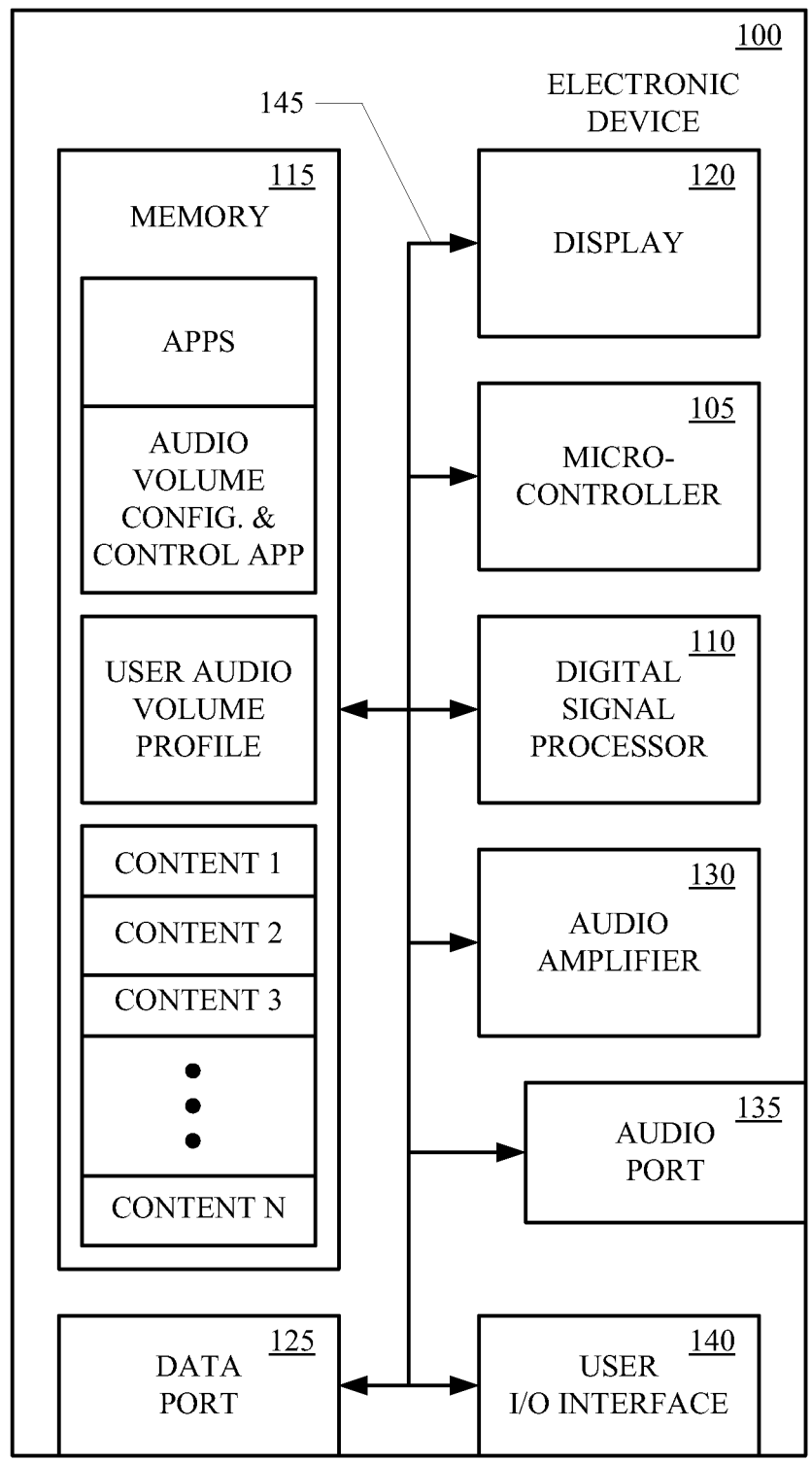
FIG. 1 shows a block diagram of an exemplary electronic device, for implementing embodiments of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that throughout discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Referring now to FIG. 1, an exemplary electronic device, for implementing embodiments of the present technology, is shown. The electronic device 100 may be a digital music player, a smart phone, personal digital assistant, game console, or the like. The electronic device renders audio and/or audio/video content such as music, movies, games, voice communication, and the like.

The electronic device 100 may include one or more processing units 105, 110, one or more computing device readable media (e.g., memory) 115, one more input/outputs 120-145, and the like, communicatively coupled together by one or more buses 145. For example, a digital music player, a smart phone, personal digital assistant, game console, or the like, may include a microcontroller 105, a digital signal processor 110, memory 115, a display 120, a data port 125, an audio amplifier 130, an audio port 135, and other input/output interfaces 140, and/or the like. The data port 125 may be a USB port, FireWire port, parallel port or the like. The display 120 may be an LCD display, touch screen display or the like. The other input/output interfaces 140 may include a microphone, buttons, switches and/or the like for controlling operation of the electronic device.

The memory 115 may include solid state memory such as flash memory, magnetic memory such as a micro hard drive, and/or the like. The memory 115 provides for storage of computing device readable instructions and data. Generally, the microcontroller 105, executing one or more applications, utilities or the like, stored in the memory 115, receives content (encoded data such as MP3, MPEG, or the like files) on the data port 125. The microcontroller 105, executing one or more application, utilities or the like, stores the received content in the memory 115. One or more applications, utilities or the like may provide for receiving content in various formats (copy content from radio, compact discs, web sites, or the like). One or more applications, utilities or the like may provide for organizing the content in playlists or the like. The microcontroller 105 and/or digital signal processor 110, thereafter, executing one or more applications utilities or the like, stored in the memory 115, may render the audio or audio/video content stored in the memory 115 as audio on the audio port 135, or one or more speakers, headphones or the like integral to the electronic device. Similarly, the microcontroller 105 and/or digital signal processor 110 may render audio/video content on the display 120 and the audio port 135.

Generally, the microcontroller 105 executing one or more applications, utilities or the like, sends instructions and data to the digital signal processor 110 to control the processing of the audio or audio/video content. The digital signal processor 110 decodes (e.g., uncompress) the audio or audio/video content encoded in one or more formats. Even within one format, different audio content may be encoded with different volume levels (e.g., min, max, average). The audio content or the audio portion of audio/video content may be converted by the digital signal processor 100 into an analog signal. The amplifier 130 amplifies the analog signal for driving one or more speakers, headphones or the like, coupled to the audio port 135 or integral to the electronic device.

Generally, the microcontroller 105 executing one or more applications, utilities or the like, may also monitor user inputs received on one or more user input/output interfaces 140, a touch screen display 120, and/or the like. The microcontroller 105 executing one or more applications, utilities or the like, may also display information about the operation of the electronic device, the content, and/or the like on the display 120.

The microcontroller 105 executing one or more applications, utilities or the like may also implement functions for audio configuration and control based on a user audio profile. The functions may provide for configuring a user audio profile and/or the adjustment of one or more audio output parameters. In other implementations, one or more functions for configuring and controlling one or more audio output parameters based upon a user audio profile may be implemented in hardware.

Figure 2:
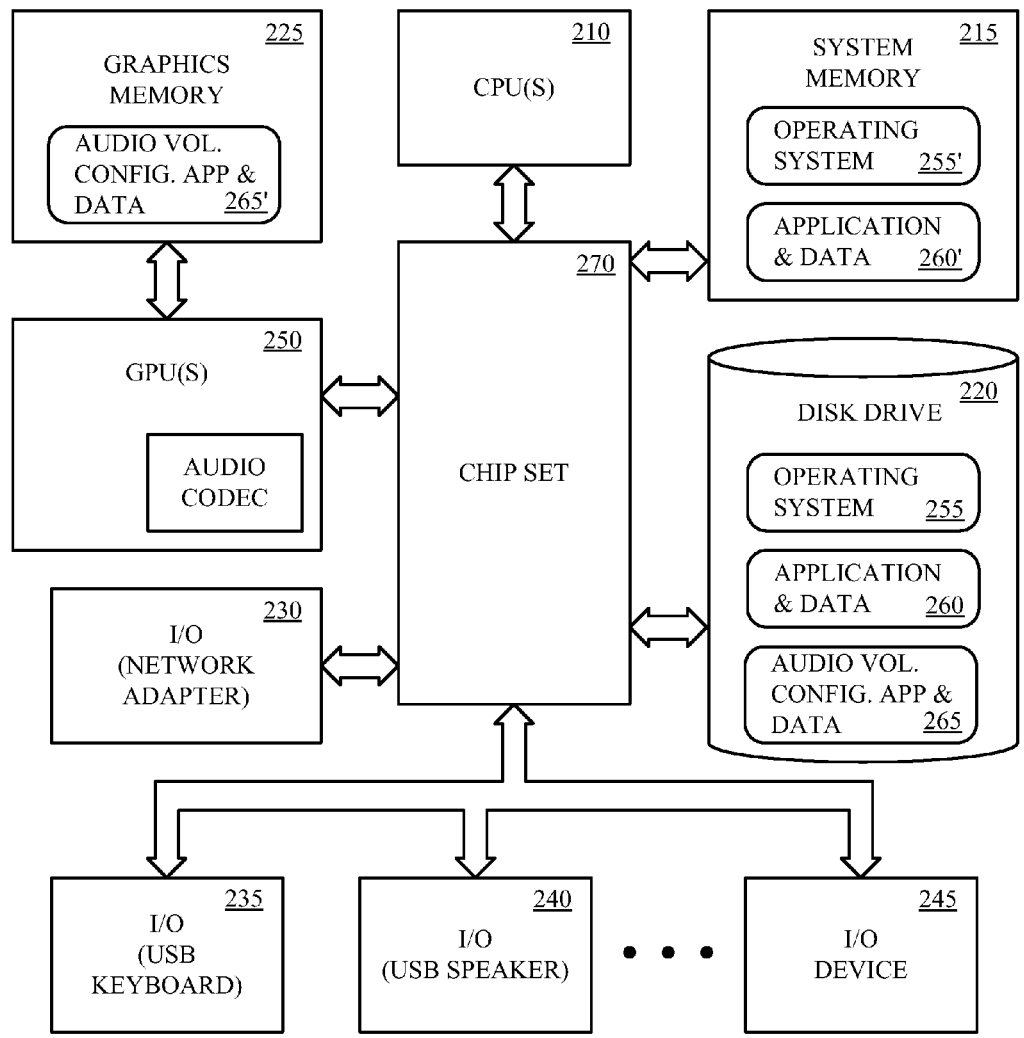
FIG. 2 shows a block diagram of another exemplary electronic device, for implementing embodiments of the present technology.

Referring now to FIG. 2, another exemplary electronic device, for implementing embodiments of the present technology, is shown. The electronic device 200 may be a desktop personal computer, laptop computer, game console, personal entertainment center, media center PC, tablet PC or the like. The electronic device 200 may include one or more general purpose processors (e.g., CPU) 210, one or more computing device-readable media 215, 220, 225, and one or more input/output (I/O) devices 230-245 communicatively coupled together by one or more buses. The I/O devices 230-245 may include a network adapter (e.g., Ethernet card), CD drive, DVD drive and/or the like, and peripherals such as a keyboard, a pointing device, a speaker, a microphone, a printer, and/or the like. The electronic device may also include one or more specialized processors, such as a graphics processing unit (GPU) 250.

The computing device-readable media 215-225, I/O devices 230-245, and GPU 250 may be communicatively coupled to the processor 210 by a chip set 270 and one or more busses. The chipset 270 acts as a simple input/output hub for communicating data and instructions between the processor 210 and the computing device-readable media 215-220, I/O devices 230-245, and the GPU 250.

The computing device-readable media 215-225 may be characterized as primary memory and secondary memory. Generally, the secondary memory, such as a magnetic and/or optical storage, provides for non-volatile storage of computing device readable instructions and data for use by the electronic device 200. For instance, the disk drive 220 may store the operating system (OS) 255, applications and data 260, audio volume configuration application and data 265. The primary memory, such as the system memory 215 and/or graphics memory 225, provides for volatile storage of computing device readable instructions and data for use by the electronic device 200. For instance, the system memory 215 may temporarily store a portion of the operating system 255', and a portion of one or more applications and associated data 260' that are currently used by the CPU 210, GPU 250 and the like. The graphics memory 225 may temporarily store a portion of one or more applications and associated data, such as the audio volume configuration application and data 265', that are currently used by the GPU 250.

One or more processing units, such as the GPU 250, executing one or more applications, utilities or the like may implement functions for audio configuration and control based on a user audio profile. The functions may provide for configuring a user audio profile and/or the adjustment of one or more audio output parameters. In other implementation, one or more functions for configuring and controlling one or more audio output parameters based upon a user audio profile may be implemented in hardware of the GPU 250 for example, or the like.

Figure 3:
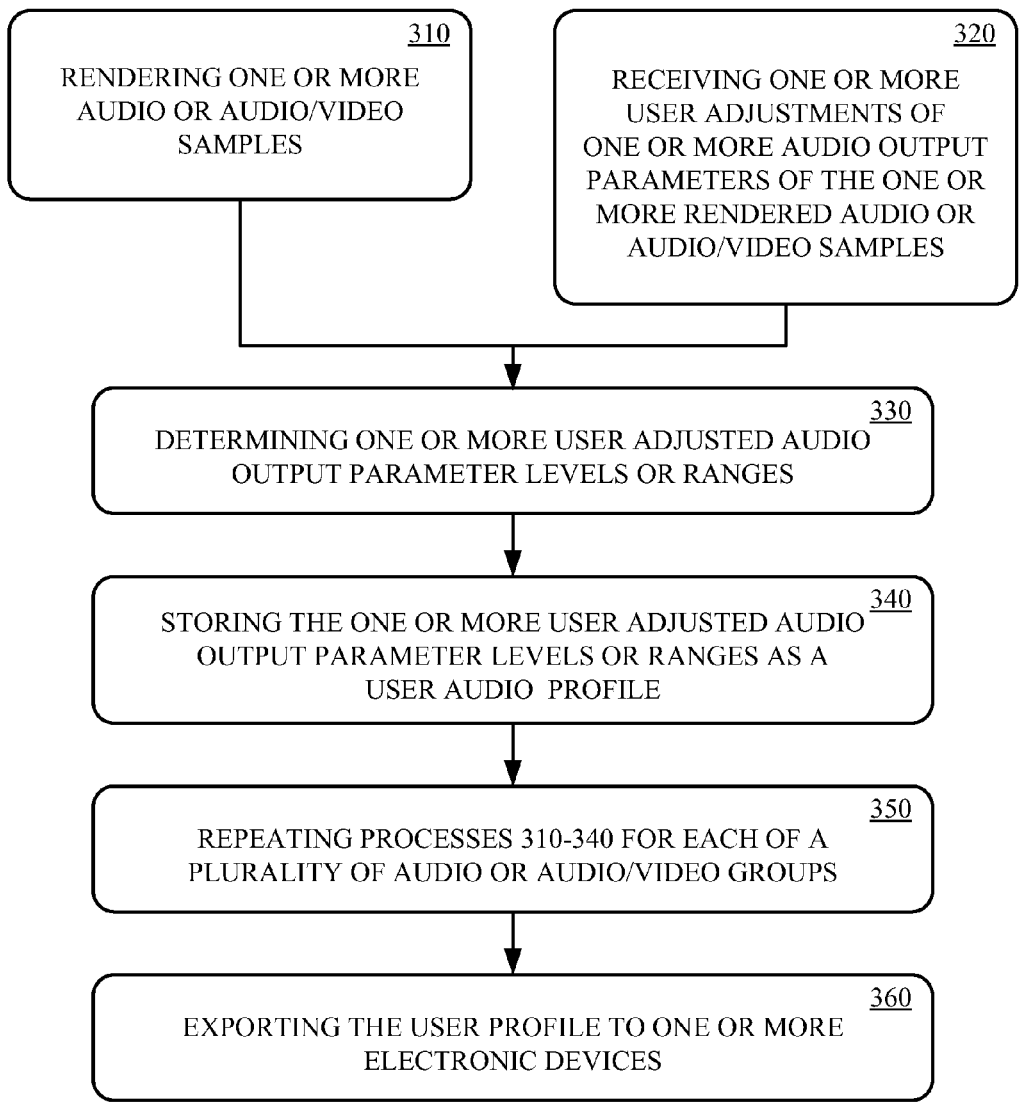
FIG. 3 shows a flow diagram of a method of configuring a user profile for controlling an audio level, in accordance with one embodiment of the present technology.

The techniques for automatic feedback and amplitude adjustment implemented by electronic device 100, 200, in accordance with embodiments of the present technology, will be further described with reference to FIGS. 3 and 4. A method of configuring a user profile for controlling an audio level, in accordance with one embodiment of the present technology, is shown in FIG. 3. The method may be implemented in hardware, firmware, as computing device-executable instructions (e.g., computer program) that are stored in computing device-readable media (e.g., computer memory) and executed by a computing device (e.g., processor), or any combination thereof, as described with reference to electronic device 100 and 200 for example.

The method may begin with rendering one or more audio or audio/video samples, at 310, and receiving one or more user adjustments of one or more audio output parameters of the one or more rendered audio or audio/video samples, at 320. The user can adjust the desired value or range for each of one or more parameters. The adjustment can be performed for multiple audio and/or audio/video samples to improve the accuracy of the determined user's desired range of each of one or more parameters.

At 330, one or more user adjusted audio output parameter levels and/or ranges are determined. The one or more audio output parameters may include the average audio amplitude, the mean audio amplitude, the peak (e.g., maximum) audio amplitude, the minimum audio amplitude, the interval between peaks, the interval between minimum values, the interval between a peak and a minimum value, and/or the like. The one or more audio output parameter levels and/or ranges may be encoded in a digital and/or analog format At 340, the one or more user adjusted audio output parameter levels or data characterizing the adjustments are stored as a user audio profile. The determined user's desired value or range of one or more audio output parameter levels may be stored in the memory of an electronic device 100, 200 as a user audio profile. In one implementation, the desired mean, minimum and/or peak amplitude for audio output are recorded. In addition, to the amplitude of the output, the intervals between the peaks and minimum values may also be taken into consideration. For example, the user may be able to withstand many peaks that are close together, while another user may appreciate such a peak but not when the peak occurs for an extended period.

At optional process 350, the processes of 310-340 may be repeated for each of a plurality of audio or audio/video groupings. The groupings may be a plurality of genres, such as rock, pop, rap, and the like. In another example, the groupings may be for listening when working, exercising, relaxing, and the like. In yet another example, the grouping may be for listening when the background (e.g., ambient) noise level is low (e.g., at home), moderate (e.g., in the office), loud (e.g., while commuting) and/or the like. In such case the processes of 310-340 may be repeated while sensing the background noise level using a microphone. In addition, different grouping types may be combined to determine the one or more audio output parameters for various combinations.

At optional process 360, the user profile may be exported to one or more electronic devices. In one implementation, the user profile may be exported to other compatible electronic devices. The process of exporting the profile may include converting from a format applicable to the originating electronic device to a format applicable to the destination electronic device. Exporting the user profile to one or more electronic devices may advantageously eliminate the need for the user to perform the configuration on multiple electronic devices.

Figure 4:
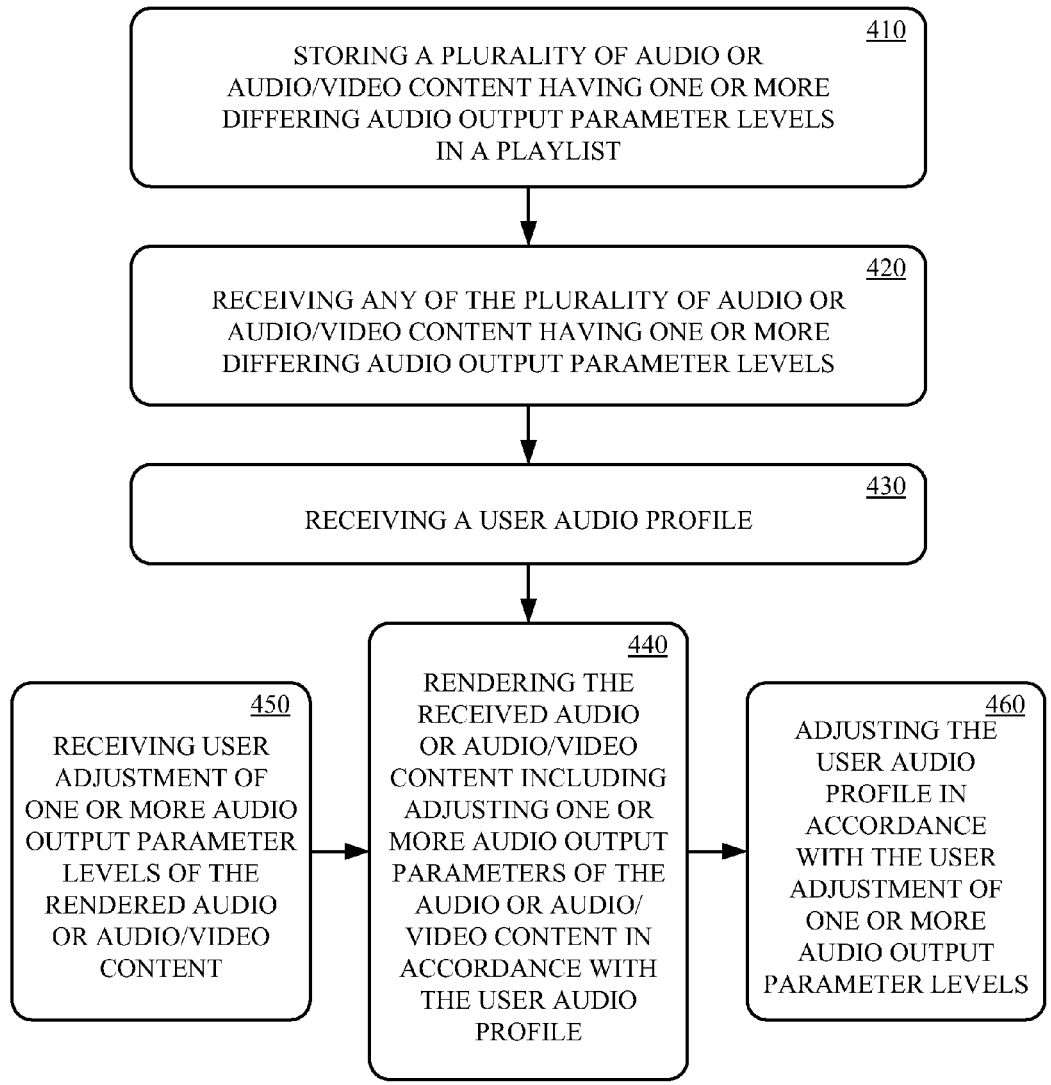
FIG. 4 shows a flow diagram of a method of controlling an audio output level based on a user profile, in accordance with one embodiment of the present technology.

Referring now to FIG. 4, a method of controlling an audio output level based on a user profile, in accordance with one embodiment of the present technology, is shown. The method may be implemented in hardware, firmware, as computing device-executable instructions (e.g., computer program) that are stored in computing device-readable media (e.g., computer memory) and executed by a computing device (e.g., processor), or any combination thereof, as described with reference to electronic device 100 and 200 for example.

The method may begin with storing a plurality of audio or audio/video content having differing audio output parameter levels in a playlist, at optional process 410. For example, the audio and/or audio/video content stored in the playlist may be encoded according to various standards. Even for audio and/or audio video content encoded according to the same standard, the content may be encoded at one or more audio parameter levels.

At 420, any of a plurality of audio or audio/video content may be received for rendering having one or more differing audio output parameter levels. The audio or audio/video content may be received from memory of the electronic device where it is stored in a digital format. The digital formatted audio or audio/video content may be encoded in any one of a plurality of encoding standards.

At 430, a user audio profile is received. The user audio profile may be received from the memory of the electronic device. The user audio profile specifies a user's desired value or range of one or more audio output parameter levels. The desired value or range of the audio output parameters may be specified in a digital format, in an analog format or combinations of both. The one or more audio output parameters may include the average audio amplitude, the mean audio amplitude, the peak (e.g., maximum) audio amplitude, the minimum audio amplitude, the interval between peaks, the interval between minimum values, the interval between a peak and a minimum value, and/or the like. The user profile may specify a value or a range of each of one or more audio output parameters for each of a plurality of audio and/or audio/video groupings. The groupings may be a plurality of genres, such as rock, pop, rap, and the like. In another example, the groupings may be for listening when working, exercising, relaxing, and the like. In yet another example, the grouping may be for listening when the background (e.g., ambient) noise level is low (e.g., at home), moderate (e.g., in the office), loud (e.g., while commuting) and/or the like.

At 440, the received audio or audio/video content is rendered, including adjusting one or more audio output parameters of the content in accordance with the user audio profile. The audio or audio/video content may be rendered by converting the digital data encoded according to any of a plurality of encoding standards into an analog format having an audio output in accordance with the one or more audio output parameter values or ranges specified in the user audio profile. The audio output parameters may be adjusted while in a digital or analog format in accordance with the user audio profile. In one implementation, the audio volume configuration and control application and/or hardware of the electronic device 100, 200 monitors one or more audio output parameters of the rendered audio output. When one or more audio output parameters goes outside the value or range specified in the user audio profile, the audio volume configuration and control application and/or hardware of the electronic device 100, 200 adjusts the corresponding one or more audio output parameters. For example, the volume (e.g., mean amplitude) may be increased or decreased to maintain the audio output in a desired range specified in the user audio profile. The audio output is advantageously automatically adjusted to the preferred audible level of the user, in accordance with one or more audio output parameters specified in the user audio profile.

At optional process 450, one or more user adjustments of one or more audio output parameter levels of the rendered audio or audio/video content may be received. At operational process 460, the user audio profile may be adjusted in accordance with the received user adjustment of one or more audio output parameter levels of the rendered audio or audio/video content. For example, if the user lowers the volume, the comfort zone of the user may have decreased, and hence the mean, minimum, and/or peak amplitude values may be decreased accordingly. When adjusting the user profile in response to user adjustment of the rendered audio or audio/video the sampling size for determining one or more user adjusted audio output parameter levels or ranges increases, resulting in an even more accurate user audio profile configuration.

It is also appreciated that portions of the electronic device may be placed in a low power mode (e.g., sleep or standby mode) when the applicable circuit is not being used. For example, the user interface circuitry may be placed in a low power mode when it is not being used while songs in a playlist are being played. However, if the user has to adjust the audio output level regularly because various songs in the playlist have different output levels, the user input circuitry will need to be regularly woken up from its low power mode. Repeatedly waking up a circuit from a low power mode reduces or eliminates the power savings of the low power mode. The user profile based audio adjustment techniques of the present technology can advantageously improve the power savings by enabling portions such as the user interface circuitry to remain in the low power mode, because the user is not regularly adjusting the volume manually.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. An apparatus comprising:
    at least one computer memory that is not a transitory signal and that includes instructions executable by at least one processor for configuring the processor for:
        rendering one or more audio or audio/video configuration samples;
        receiving one or more user adjustments of one or more audio output parameters of the one or more rendered audio or audio/video configuration samples;
        determining one or more user adjusted audio output parameter levels or ranges; and
        storing the one or more user adjusted audio output parameter levels or ranges as a user audio profile, wherein the one or more audio output parameters comprise an interval between amplitude features.

2. The apparatus of claim 1, wherein the one or more audio output parameters comprise one or more selected from the group consisting of an average audio amplitude, a mean audio amplitude, a peak audio amplitude, a minimum audio amplitude, an interval between amplitude peaks, an interval between amplitude minimums, and an interval between an amplitude peak and an amplitude minimum.

3. The apparatus of claim 1, wherein the user audio profile includes data characterizing a user's desired value or range of one or more audio output parameter levels.

4. The apparatus of claim 1, wherein the instructions when executed by the processor further configure the processor for repeating the rendering, receiving, determining and storing for each of a plurality of audio or audio/video groups.

5. The apparatus of claim 1, wherein the instructions when executed by the processor further configure the processor for exporting the user audio profile to one or more electronic devices.

6. The apparatus of claim 1, where instructions when executed by the processor further configure the processor for:
    receiving any of a plurality of audio or audio/video content having one or more differing audio output parameter levels;
    receiving the user audio profile; and
    rendering the received audio or audio/video content including adjusting one or more audio output parameters of the audio or audio/video content in accordance with the user audio profile.

7. The apparatus of claim 6, wherein the instructions when executed by the processor further configure the processor for converting the audio or audio/video content in a digital format to an analog format having an audio output in accordance with one or more audio output parameter values or ranges specified in the user audio profile.

8. The apparatus of claim 6, wherein the instructions when executed by the processor further configure the processor for receiving any of the plurality of audio or audio/video content from a playlist.

9. The apparatus of claim 6, wherein the instructions when executed by the processor further configure the processor for:
    receiving a user adjustment of one or more audio output parameter levels of the rendered audio or audio/video content; and
    adjusting the user audio profile in accordance with the user adjustment of the one or more audio output parameter levels.

10. The apparatus of claim 1, wherein the interval is an interval between amplitude peaks.

11. The apparatus of claim 1, wherein the interval is an interval between amplitude minimums.

12. The apparatus of claim 1, wherein the interval is an interval between an amplitude peak and an amplitude minimum.

* * * * *